US012529805B2

(12) United States Patent
Andreou et al.

(10) Patent No.: US 12,529,805 B2
(45) Date of Patent: Jan. 20, 2026

(54) FRONT-END ELECTRONIC CIRCUITRY FOR AN ELECTROMAGNETIC RADIATION SENSOR APPLICATION

(71) Applicant: ams International AG, Jona (CH)

(72) Inventors: Charalambos Andreou, Tann (CH); Fridolin Michel, Au (CH)

(73) Assignee: ams International AG, Jona (CH)

( * ) Notice: Subject to any disclaimer, the term of this patent is extended or adjusted under 35 U.S.C. 154(b) by 263 days.

(21) Appl. No.: 18/557,599

(22) PCT Filed: Apr. 28, 2022

(86) PCT No.: PCT/EP2022/061327
§ 371 (c)(1),
(2) Date: Oct. 27, 2023

(87) PCT Pub. No.: WO2022/233699
PCT Pub. Date: Nov. 10, 2022

(65) Prior Publication Data
US 2024/0219590 A1    Jul. 4, 2024

(30) Foreign Application Priority Data

May 3, 2021 (DE) .......................... 102021111362.8

(51) Int. Cl.
*G01T 1/24* (2006.01)
(52) U.S. Cl.
CPC .................... *G01T 1/247* (2013.01)
(58) Field of Classification Search
None
See application file for complete search history.

(56) References Cited

U.S. PATENT DOCUMENTS

| 8,384,038 B2 | 2/2013 | Guo et al. |
| 8,415,635 B2 | 4/2013 | Marks et al. |

(Continued)

FOREIGN PATENT DOCUMENTS

| EP | 2645706 A2 | 10/2013 |
| EP | 3780394 A1 | 2/2021 |

(Continued)

OTHER PUBLICATIONS

Krummenacher, F., "Pixel detectors with local intelligence: an IC designer point of view", Nuclear Instruments & Methods in Physics Research, vol. A305 No. 3, Elsevier Science Publishers B.V., North-Holland, Aug. 1, 1991, pp. 527-532.

(Continued)

*Primary Examiner* — Edwin C Gunberg
(74) *Attorney, Agent, or Firm* — Viering, Jentschura & Partner mbB (57) ABSTRACT

A front-end electronic circuitry for an electromagnetic radiation sensor application includes a signal shaper circuit with an amplifier circuit and an active dynamic feedback circuit, the active dynamic feedback circuit being arranged in a feedback path of the signal shaper circuit. The active dynamic feedback circuit includes a first input transistor being arranged in a first current path of the active dynamic feedback circuit, and a second input transistor being arranged in a second current path of the active dynamic feedback circuit. The first input transistor has a control node to receive an output signal of the signal shaper circuit, and the second input transistor has a control node to receive a reference signal. The active dynamic feedback circuit includes a buffer circuit being arranged to decouple the first and second current path.

15 Claims, 9 Drawing Sheets

(56) References Cited

U.S. PATENT DOCUMENTS

| | | | |
|---|---|---|---|
| 10,809,395 | B2 | 10/2020 | Zhao et al. |
| 11,340,643 | B2 * | 5/2022 | Hu .................... H03F 3/45269 |
| 2010/0172467 | A1 | 7/2010 | Steadman Booker et al. |
| 2010/0207027 | A1 | 8/2010 | Marks et al. |
| 2010/0329425 | A1 | 12/2010 | Guo et al. |
| 2011/0210235 | A1 | 9/2011 | Dierickx |
| 2016/0377745 | A1 | 12/2016 | Daerr et al. |
| 2017/0038480 | A1 | 2/2017 | Groepl et al. |
| 2020/0014332 | A1 | 1/2020 | Hageraats et al. |
| 2020/0064500 | A1 | 2/2020 | Steadman Booker et al. |
| 2021/0156974 | A1 * | 5/2021 | Kashmiri .................. H03F 3/08 |

FOREIGN PATENT DOCUMENTS

| | | |
|---|---|---|
| JP | 2015012617 A | 1/2015 |
| JP | 2016540208 A | 12/2016 |
| JP | 2020010333 A | 1/2020 |
| JP | 2020516878 A | 6/2020 |
| WO | 2021028195 A1 | 2/2021 |

OTHER PUBLICATIONS

Szczygiel, R. et al., "A Prototype Pixel Readout IC for High Count Rate X-Ray Imaging Systems in 90 nm CMOS Technology", IEEE Transactions on Nuclear Sience, vol. 57 No. 3, IEEE, Jun. 2010, pp. 1664-1674.

Kmon, P. et al., "Active Feedback With Leakage Current Compensation for Charge Sensitive Amplifier Used in Hybrid Pixel Detector", IEEE Transactions on Nuclear Science, vol. 66 No. 3, IEEE, Mar. 2019, pp. 664-673.

Grybos, P., "Pole-Zero Cancellation Circuit for Charge Sensitive Amplifier with Pile-up Pulses Tracking System", IEEE Nuclear Science Symposium Conference Record, IEEE, 2006, pp. 226-230.

Kraft, Edgar et al., "Counting and Integrating Readout for Direct Conversion X-ray Imaging: Concept, Realization and First Prototype Measurements", IEEE Transactions on Nuclear Science, vol. 54 No. 2, IEEE, Apr. 2007, pp. 383-390.

Llopart, X. et al., "Medipix2, a 64k pixel read out chip with 55 mm square elements working in single photon counting mode", IEEE Nuclear Science Symposium Conference Record, vol. 3, IEEE, 2002, 5 pages.

International Search Report for corresponding International Patent Application No. PCT/EP2022/061327, dated Aug. 4, 2022, 3 pages (for informational puposes only).

Search Report for corresponding German Patent Application 10 2021 111 362.8, dated Mar. 18, 2022, 11 pages (for informational purposes only).

Japanese office action issued for the corresponding Japanese patent application No. 2023564057, dated Oct. 29, 2024, 5 pages (for informational purposes only).

* cited by examiner

FRONT-END ELECTRONIC CIRCUITRY FOR AN ELECTROMAGNETIC RADIATION SENSOR APPLICATION

RELATED APPLICATION(S)

This application is a US National Stage Application of International Application PCT/EP2022/061327, filed on 28 Apr. 2022, and claims priority under 35 U.S.C. § 119 (a) and 35 U.S.C. § 365 (b) from German Application DE 10 2021 111 362.8, filed on 3 May 2021, the contents of which are incorporated herein by reference in their entirety.

TECHNICAL FIELD

The disclosure relates to a front-end electronic circuitry for an electromagnetic radiation sensor application, and particularly an X-ray imaging application or a photon-counting application, such as multi-energy spectral CT (Computed Tomography). The disclosure further relates to a photon-counting sensor circuitry using the front-end electronic circuitry, and a device for medical diagnostics.

BACKGROUND

Classical CT machines and X-ray imaging products use indirect conversion sensors. Indirect conversion sensors comprise a scintillator to convert X-rays to visible light which is captured by a photodetector or a photodiode to provide an electrical signal in response to the X-rays impinging on the material of the scintillator.

As opposed to conventional computed tomography using the indirect detection principle, direct conversion sensors allow to generate an electrical signal, when incident photons hit the direct conversion material, such as CdTe/CZT. The direct conversion materials along with a continuous-time asynchronous frond-end electronics allows a CT machine to benefit from the advantage of a photon-counting system. Photon-counting medical imaging has a number of advantages over the classical approach, such as better resolution and/or lower dose as well as spectral information.

A photon-counting imaging system requires a high-speed and asynchronous continuous-time processing of an input signal (input current pulse). In particular, the photon-counting approach requires a front-end circuitry that receives a current input and, at the output, provides a voltage that is shaped in order to facilitate further processing by discriminators.

The front-end topologies are usually single-stage approaches and two-stage approaches. For small and fixed input capacitance, a single-stage architecture can be employed, which incorporates a signal shaper circuit comprising an amplifier circuit followed by discriminators and counters.

Figure 1:
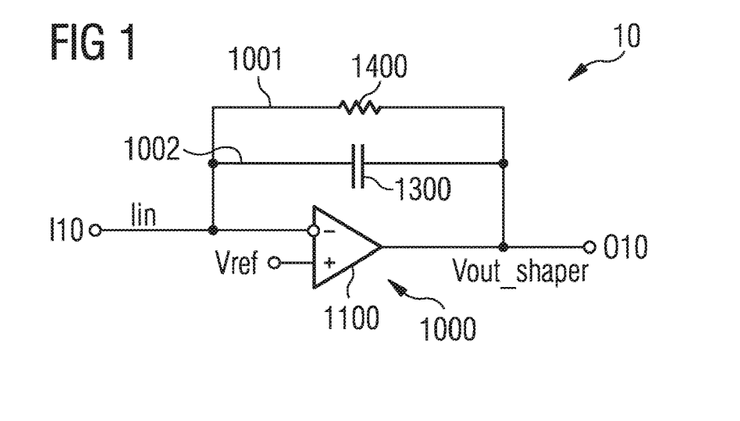
FIG. 1 shows a conventional embodiment of a front-end electronic circuitry for an electromagnetic radiation sensor application comprising a differential signal shaper circuit with resistive feedback.

FIG. 1 shows a front-end electronic circuitry 10 according to a single-stage approach comprising a signal shaper circuit 1000 having an input terminal I10 to receive an input signal Iin from an electromagnetic radiation sensor, for example a photon detector. The signal shaper circuit 1000 comprises a an amplifier circuit 1100 having an input side to receive an input signal Iin from the sensor and a reference signal Vref, and an output side to provide an output signal Vout_shaper at an output terminal O10 of the front-end circuitry. A capacitor 1300 is arranged in a feedback path 1002 between the input side and the output side of the amplifier circuit 1100. A feedback element 1400 that may be configured as a resistor is arranged in a feedback path 1001 in parallel to the capacitor 1300.

When incident photons hit the direct conversion material of the photon detector, a transient current signal is generated. This current is proportional to the energy of the incident photon. The current is applied as input signal/input current pulse Iin to the input terminal I10, and is then processed by the signal shaper circuit 1000 that will provide a shaped voltage at the output terminal O10, which is proportional to the input current and hence proportional to the energy of every single incident photon. The shaper output voltage can be further processed by several discriminators and counters. The number of counts is proportional to the number of incident photons. Having multiple discriminators and counters will additionally give information of the energy level of each incident photon.

For large and varying input capacitance, a two-stage architectural approach of the front-end electronic circuitry can be used. Instead of the single-stage signal shaper circuit, the signal shaper circuit of the two-stage front-end approach comprises a charge-sensitive-amplifier coupled to a shaper amplifier followed by discriminators and counters. While the two-stage topology of a front-end electronic circuitry decouples the signal shaper stage from an input capacitance at the input of the front-end electronic circuitry, because the charge sensitive amplifier acts as a buffer, the two-stage front-end circuitry comes with higher noise and power penalty.

The baseline of the output of the signal shaper circuit is defined by a reference voltage connected at the positive input terminal of both, the charge-sensitive amplifier and the shaper amplifier, which are usually differential-input and single-ended output operational transconductance amplifiers (OTAs).

The most important performance parameters of a photon-counting front-end are low-power, low-noise, high count-rate, small FWHM (Full Width Half Maximum) related to the pulse-width of the shaped output, small silicon area, high-linearity and low ballistic deficit.

In order to reduce the pulse width and therefore the FWHM performance as well as to increase the count-rate, the above-mentioned topologies are required to consume large power. This induces other problems, such as heat and thermal stability effects which are not desirable by such a system.

The most important building block of a photon-counting front-end is the signal shaper circuit along with its feedback elements. The configuration of this block is critical for determining the performance of the front-end and therefore the overall system performance. The signal shaper circuit itself has to exhibit a high transconductance gm in order to achieve the required bandwidth. However, in order to achieve a high enough bandwidth to enable high count rates, the shaper circuit has to burn significant amount of power.

Here is where the feedback elements come into play, which are the feedback resistance and the feedback capacitance. The feedback capacitance has to be small enough in order to reduce the FWHM for high count rates and minimize pileup. However, there is a minimum capacitance required in order to maintain enough phase-margin and avoid stability issues.

The other feedback element is the resistance, which can be implemented with a standard resistor (e.g. a polysilicon resistor) or a MOS transistor operated in the linear region. The latter one may be used since it saves area and the resistor value can be very large as well as it provides a saturating behavior when the shaper output moves away from the baseline during pulse activity, when incident radiation hits the target material of the sensor.

Another feedback implementation is using an active transconductor. However, when there are large input energies, which lead to large amplitude of the input pulses, or when there are pileup events the existing active feedback topologies would enter current starving and therefore fail to further process the input signals.

There is a need to provide an approach for a front-end electronic circuitry for an electromagnetic radiation sensor application that reduces pulse-width, hence the FWHM of the shaper output and additionally improves recovery from pileup without burning an excessive amount of power in the signal shaper circuit.

SUMMARY

A front-end electronic circuitry for an electromagnetic radiation sensor application that enhances the pulse-width and hence the FWHM of a signal shaper output of the front-end electronic circuitry, and additionally improves the count-rate during pileup is specified in claim 1.

The front-end electronic circuitry comprises an input terminal being configured to be coupled to the electromagnetic radiation sensor to receive an input signal from the sensor, and an output terminal to provide an output signal. The front-end electronic circuitry comprises a signal shaper circuit. The signal shaper circuit comprises an amplifier and an active dynamic feedback circuit that is arranged in a feedback path of the amplifier circuit. The amplifier circuit has an input node being coupled to the input terminal of the front-end electronic circuit, and an output node to provide an output signal. The output node of the amplifier circuit is coupled to the output terminal of the front-end electronic circuitry.

The active dynamic feedback circuit comprises a first input transistor being arranged in a first current path of the active dynamic feedback circuit. The active dynamic feedback circuit further comprises a second input transistor being arranged in a second current path of the active dynamic feedback circuit. The first input transistor has a control node to receive the output signal. The second input transistor has a control node to receive a reference signal. The active dynamic feedback circuit comprises a buffer circuit being arranged to decouple the first and second current path.

The proposed active dynamic feedback circuit allows to improve the input dynamic range of the signal shaper circuit as well as the current starving limit during pileup events by enhancing the pulse-shape and FWHM. In order to achieve this, the proposed active dynamic feedback circuit intentionally introduces non-linearity by realizing a non-linear feedback resistance (1/gm) in the feedback path of the front-end electronic circuitry. As a result, the count-rate is significantly improved without burning excessive amount of power in the signal shaper amplifier circuit. The topology is highly robust to PVT and mismatch. In addition, it allows a regulation of the shaper output to the voltage level of the reference signal independent of PVT.

According to an embodiment of the front-end electronic circuitry, the first current path and the second current path are respectively connected between a terminal to provide a reference potential and a common node of the active dynamic feedback circuit. The buffer circuit is arranged between the common node and the first input transistor to decouple the first and second current path.

The buffer circuit enables the respective bias current of the first input transistor and the second input transistor to be respectively decoupled so as to be able to process large signals or large deviations from the baseline at the shaper output without starving the second input transistor and cause clipping of the output.

According to an embodiment of the front-end electronic circuitry, the active dynamic feedback circuit comprises a third current path. The active dynamic feedback circuit further comprises a current source being arranged in the third current path between a terminal to provide a supply potential and the common node. The third current path is connected in series to each of the first and second current path.

According to an embodiment of the front-end electronic circuitry, the buffer circuit comprises a first and a second input node and an output node. The first input node of the buffer circuit is connected to the common node. The second input node of the buffer circuit is coupled to the output node of the buffer circuit. According to a possible embodiment, the second input node of the buffer circuit is directly connected to the output node of the buffer circuit, or, according to another possible embodiment, the second input node of the buffer circuit is coupled to the output node of the buffer circuit via a feedback network. The output node of the buffer circuit is connected to the first input transistor.

According to an embodiment of the front-end electronic circuitry, the buffer circuit comprises a transistor, and a current source. The transistor is arranged in a fourth current path of the active dynamic feedback circuit. The first current path and the fourth current path are connected in parallel between a terminal to provide a reference potential and a second common node of the active dynamic feedback circuit. The current source is arranged in a fifth current path of the active dynamic feedback circuit between a terminal to provide a supply potential and the second common node. The current source coupled to the second common node guarantees stable current definition over PVT.

According to an embodiment of the front-end electronic circuitry, the buffer circuit comprises an amplifier having a first input node being connected to the common node of the active dynamic feedback circuit. The amplifier of the buffer circuit further comprises a second input node being connected to the second common node of the active dynamic feedback circuit. The amplifier of the buffer circuit has an output node being connected to a control node of the transistor of the buffer circuit.

The amplifier of the buffer circuit enables the respective bias current of the first input transistor and the transistor of the buffer circuit to be respectively decoupled so as to be able to process large signals or large deviations from the baseline at the shaper output without starving the second input transistor and cause clipping of the output and also cause saturation of the shaper output. The decoupling of the first current path and the fourth current path by the buffer circuit enables a low-impedance node to be created at the second common node of the active dynamic feedback circuit.

The decoupling of the respective bias current in the first and fourth current path allows for a small current in the first current path so as to get low transconductance and therefore a high resistance in the feedback path of the signal shaper circuit. On the other hand, the decoupling of the respective bias current in the first and fourth current path allows for a large current in the fourth current path so as to be able to provide excess current required by a large signal generated at the output node of the amplifier circuit of the signal shaper circuit without getting starved and causing clipping of the output.

The amplifier of the buffer circuit provides an impedance transformation that allows the second common node of the active dynamic feedback circuit at the drain of the current source of the buffer circuit to be transformed from high-impedance to low-impedance.

According to an embodiment of the front-end electronic circuitry, the first input transistor is operated in weak inversion. As explained above, the active dynamic feedback circuit introduces non-linearity by realizing a non-linear feedback resistance. The non-linearity is achieved, inter alia, by biasing the first input transistor in weak inversion, as opposed, for example to a MOS-resistor that is often conventionally provided in the feedback path of a signal shaper circuit.

A MOS-resistor in the feedback path of the signal shaper circuit needs to be biased in strong inversion so as to reduce the resistance variation due to its gate bias which spreads due to PVT variations of the bias generator. In addition, non-linearity is achieved by the fact that the potential of the second common node is fixed with a large current by the transistor of the buffer circuit in the fourth current path, and, therefore, the second common node becomes like a low-impedance node. The decoupling of the current in the first current path and the current in the fourth current path is achieved by the amplifier of the buffer circuit.

The non-linearity intentionally introduced in the feedback path of the signal shaper stage by the active dynamic feedback circuit enables that the full large signal amplitude of the output signal provided at the output node of the amplifier circuit of the signal shaper circuit can be applied to the first input transistor overdrive without being degraded by a drop of the voltage at the second common node of the buffer circuit which would otherwise occur.

According to an embodiment of the front-end electronic circuitry, the first and second input transistor are matched to each other. Furthermore, the first current source of the active dynamic feedback circuit and the second current source of the buffer circuit can be matched to each other.

According to an embodiment of the front-end electronic circuitry, the active dynamic feedback circuit comprises a current mirror being arranged between the first current path and a sixth current path of the active dynamic feedback circuit to couple a current from the first current path in the sixth current path of the active dynamic feedback circuit. The sixth current path of the active dynamic feedback circuit is connected to the input node of the amplifier circuit of the signal shaper circuit.

The current mirror arranged between the first current path and the sixth current path of the active dynamic feedback circuit allows to realize a small effective transconductance, i.e. a high equivalent resistance, while biasing the first input transistor with high enough current for speed and low offset.

According to an embodiment, the front-end electronic circuitry comprises a reference signal generation circuit being coupled to the control node of the second input transistor to provide the reference signal.

In addition to the active dynamic feedback circuit, the signal shaper circuit comprises a feedback capacitor being arranged between the input node of the amplifier circuit and the output node of the amplifier circuit of the signal shaper circuit. Furthermore, the signal shaper circuit comprises a third current source being arranged between a terminal to provide a supply potential and the input terminal of the front-end electronic circuitry. The first current source is matched to the third current source. The amplifier circuit can be embodied in a single-input, single-output configuration or in a differential-input, single-output configuration.

An embodiment of a possible application of the front-end electronic circuitry in a photon counting circuitry is specified in claim 14.

A photon counting circuitry comprises a front-end electronic circuitry according to one of the above-described embodiments. The photon counting circuitry further comprises a photon detector having a photon-sensitive area. The photon detector is configured to generate a current pulse, when a photon hits the photon-sensitive area. The photon counting circuitry further comprises an energy discriminator being connected to the output terminal of the front-end electronic circuitry.

The photon detector is connected to the input terminal of the front-end electronic circuitry. The front-end electronic circuitry is configured to generate a voltage pulse at the output node of the front-end electronic circuitry, when the current pulse is applied to the input node of the front-end electronic circuitry. The energy discriminator is configured to generate a digital signal in dependence on a level of the voltage pulse.

A device for medical diagnostics using the principle of photon counting is specified in claim 15.

The device comprises the photon counting circuitry, as specified above. The device may be configured as an X-ray apparatus or a computed tomography scanner.

Additional features and advantages of the front-end electronic circuitry are set forth in the detailed description that follows. It is to be understood that both the foregoing general description and the following detailed description are merely exemplary, and are intended to provide an overview or framework for understanding the nature and character of the claims.

BRIEF DESCRIPTION OF THE DRAWINGS

The accompanying drawings are included to provide further understanding, and are incorporated in, and constitute a part of, the specification. As such, the disclosure will be more fully understood from the following detailed description, taken in conjunction with the accompanying figures in which.

DETAILED DESCRIPTION

Figure 2A:
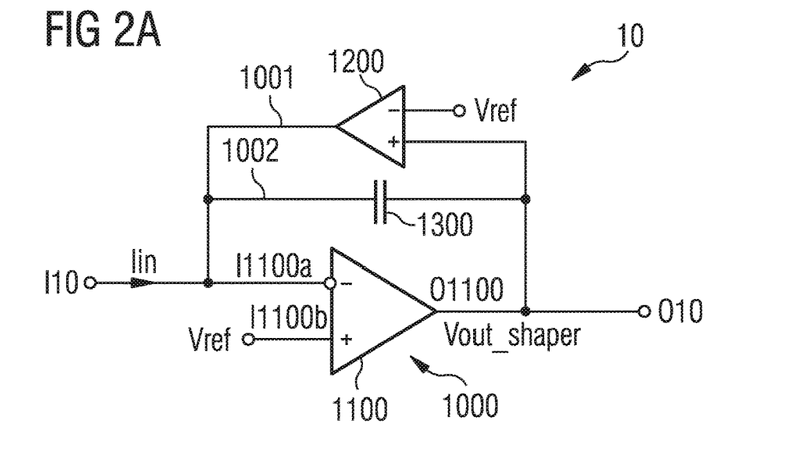
FIG. 2A shows an embodiment of a front-end electronic circuitry for an electromagnetic radiation sensor application comprising a differential-input signal shaper circuit with an active dynamic feedback circuit.
Figure 2B:
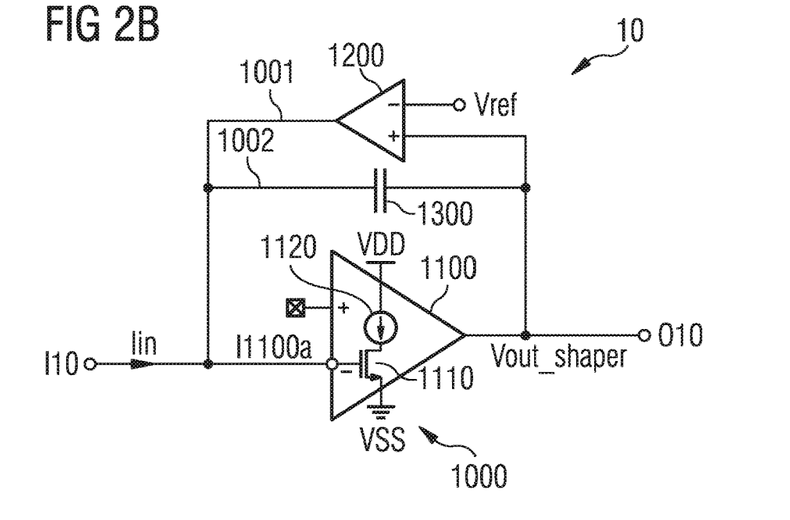
FIG. 2B shows an embodiment of a front-end electronic circuitry for an electromagnetic radiation sensor application comprising a single-input signal shaper circuit with an active dynamic feedback circuit.

FIGS. 2A and 2B respectively show an embodiment of a front-end electronic circuitry 10 for an electromagnetic radiation sensor application. The front-end electronic circuitry 10 may be used as a photon counting shaper in a photon counting circuitry. The front-end electronic circuitry 10 comprises an input terminal I10 being configured to be coupled to a sensor being sensitive to electromagnetic radiation, for example X-ray radiation, to receive an input signal Iin from the sensor. The sensor may be configured as a photon detector. The front-end electronic circuitry further comprises an output terminal O10 to provide an output signal Vout_shaper.

The front-end electronic circuitry comprises a signal shaper circuit 1000 comprising an amplifier circuit 1100 and an active dynamic feedback circuit 1200. The active dynamic feedback circuit 1200 is arranged in a feedback path 1001 of the front-end electronic circuitry 1000. The amplifier circuit 1100 has an input node I1100a being coupled to the input terminal I10 of the front-end electronic circuitry, and an output node O1100 to provide the output signal Vout_shaper. The output node O1100 of the amplifier circuit 1100 is coupled to the output terminal O10 of the front-end electronic circuitry 10. A feedback capacitor 1300 is arranged between the input node I1100a of the amplifier circuit 1100 and the output node O1100 of the amplifier circuit 1100.

FIG. 2A shows a differential input shaper approach, wherein the amplifier circuit 1100 is embodied in a differential-input, single-output configuration. The differential-input amplifier circuit 1100 has the input node I1100a to receive the input signal Iin, and a second input node I1100b to receive a reference signal Vref.

FIG. 2B shows a single-input approach of the front-end electronic circuitry 10, wherein the amplifier circuit 1100 is embodied in a single-input, single-output configuration. When compared to the differential-input shaper approach shown in FIG. 2A, the amplifier circuit 1100 of FIG. 2B only comprises the single input node I1100a to receive the input signal Iin. The amplifier circuit 1100 comprises an input transistor 1110 having a control node that is coupled to the single input node I1100a. The amplifier circuit 1100 further comprises a current source 1120 being arranged in series with the input transistor 1110.

In contrast to a front-end electronic circuitry comprising a resistive feedback, as shown in FIG. 1, the front-end electronic circuitries 10 shown in FIGS. 2A and 2B comprise an active dynamic feedback circuit 1200 in feedback path 1001 of the signal shaper circuit 1000. The active dynamic feedback circuit 1200 replaces the feedback resistor of the signal shaper circuit in the front-end circuitry of FIG. 1.

The proposed active dynamic feedback circuit 1200 introduces non-linearity by realizing a non-linear feedback resistance (1/gm). This approach significantly reduces the pulse-width and hence the Full Width Half Maximum (FWHM) of the shaper output and therefore improves the count-rate during pileup. Moreover, the front-end electronic circuitry 10 improves recovery from pileup. Therefore, the input dynamic range as well as the count-rate is increased without burning an excessive amount of power in the signal shaper circuit.

Moreover, the proposed active dynamic feedback circuit does not require a control loop within the high-speed path of the signal shaper circuit, resulting in maximum speed and phase margin. In addition, the proposed active dynamic feedback circuit allows a single-input amplifier circuit 1100 to be utilized that may be configured as an operational transconductance amplifier, as shown in FIG. 2B, which would further reduce the power consumption as well as the noise of the front-end. Without using the proposed active dynamic feedback amplifier in the feedback path 1001 that replaces the resistive element 1400 of the front-end circuitry approach FIG. 1, a single-input amplifier circuit of the signal shaper circuit is not feasible.

The active dynamic feedback circuit 1200 not only serves as a resistance via its transconductance gm, but it also regulates the baseline at the output node O1100/output terminal O10 at the reference voltage Vref. In addition, the proposed active dynamic feedback circuit also significantly improves the performance in terms of power consumption and FWHM of the signal shaper circuit.

The implementation of an active dynamic feedback circuit in the feedback path 1001 of the signal shaper circuit 1000 having the above-mentioned requirements is challenging. The reason behind the challenges are the following requirements that such a circuit has to fulfil.

Firstly, the active dynamic feedback circuit 1200 has to resemble a resistance. Assuming the active dynamic feedback circuit 1200 would be realized as an operational transconductance amplifier comprising a pair of input transistors that would share the same tail node, this may be achieved using the resistance 1/gm of one of the input transistors of the amplifier. However, since the active dynamic feedback circuit 1200 has to provide a very high value of resistance, the transconductance gm of the input transistor has to be very small, which can be achieved by a combination of a small bias current and a large overdrive voltage. The large overdrive voltage is usually limited by the supply voltage and the saturation of a current source coupled to the common tail node, while the small bias current has an impact on the speed as well as the dynamic range over which the active dynamic feedback circuit can operate. A large dynamic range, i.e. handling large pulses or pileup events, will cause starving of the other transistor of the input pair of transistors that shares the same common mode tail current.

Secondly, the active dynamic feedback circuit 1200 has to improve the FWHM. The active dynamic feedback circuit can improve the FWHM by reducing the pulse-width for pulses with large amplitude or during pileup events. This occurs in a non-linear scheme, which enhances the FWHM significantly compared to the use of a resistance as a feedback element. However, in order to play this role, the active dynamic feedback circuit has to process the shaper output pulse very fast and need to have a high-dynamic range over which it can react effectively and re-shape the output pulses. Hence, it needs a high transconductance gm which means relatively large current at the input device. This is in contradiction to the first above-mentioned requirement, where a small current is needed in order to get a sufficiently large feedback resistance.

Thirdly, the active dynamic feedback circuit 1200 has to achieve low offset. The active dynamic feedback circuit is additionally responsible for tracking the reference voltage and adjusting the output baseline of the signal shaper circuit via the feedback. Therefore, the offset due to mismatch will induce deviation to the baseline at the output node of the signal shaper circuit. A certain level of deviation is acceptable since it can be corrected by a DAC at the comparator input. However, excessive deviation will move the transconductance amplifier/comparator out of the input common-mode range, which is not acceptable.

Figure 3A:
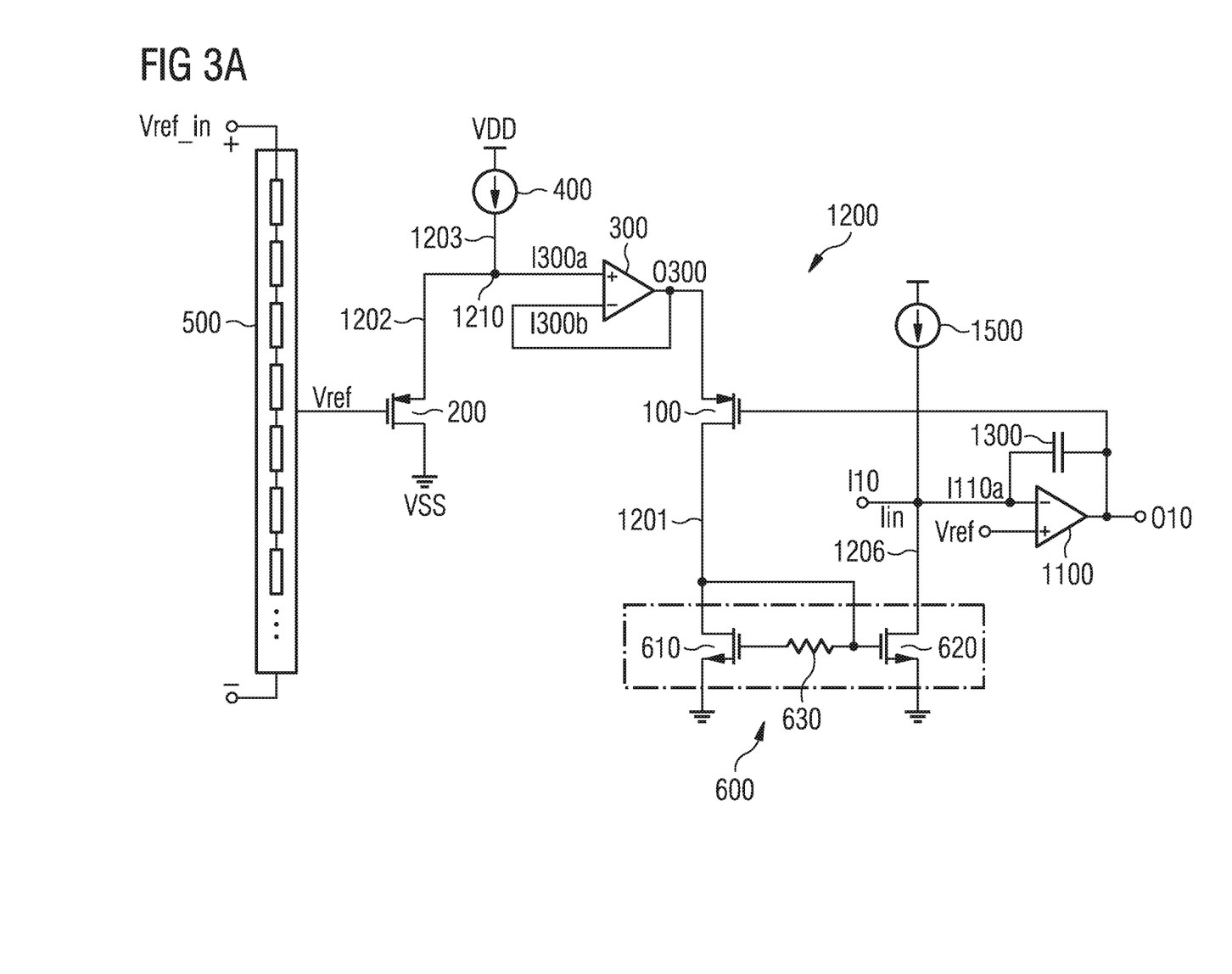
FIG. 3A shows an embodiment of a front-end electronic circuitry for an electromagnetic radiation sensor application comprising an active dynamic feedback circuit to improve input dynamic range as well as the current starving limit during pileup events by enhancing the pulse-shape.

FIG. 3A shows an embodiment of a front-end electronic circuitry 10 for an electromagnetic sensor application, for example for a photon counting front-end, comprising a signal shaper circuit 1000 with amplifier circuit 1100, active dynamic feedback circuit 1200 and feedback capacitor 1300. The signal shaper circuit 1000 comprises a current source 1500 being arranged between a terminal to provide a supply potential VDD and the input terminal I10 of the front-end electronic circuitry 10. The front-end electronic circuitry 10 allows the performance of a differential-input amplifier circuit of a signal shaper circuit to be enhanced. In addition, the proposed embodiment of the front-end electronic circuitry 10 makes feasible the realization of a single-input amplifier circuit for the signal shaper circuit.

Referring to the front-end electronic circuitry 10 of FIG. 3A, the active dynamic feedback circuit 1200 comprises a first input transistor 100 being arranged in a first current path 1201 of the active dynamic feedback circuit. The active dynamic feedback circuit 1200 comprises a second input transistor 200 being arranged in a second current path 1202 of the active dynamic feedback circuit 1200. The first input transistor 100 has a control node to receive the output signal Vout_shaper generated at the output node O1100 of the amplifier circuit 1100. The second input transistor 200 has a control node to receive a reference signal/voltage Vref. The active dynamic feedback circuit 1200 further comprises a buffer circuit 300 being arranged to decouple the first current path 1201 and the second current path 1202.

The buffer circuit 300 thus allows to decouple the bias currents in the first and second current path 1201, 1202 which further allows to process large signals or large deviations from the baseline at the output node O1100 of the amplifier circuit 1100 of the signal shaper circuit 1000 without starving the second input transistor 200 and without causing clipping of the output.

The first current path 1201 and the second current path 1202 are respectively connected between a terminal to provide a reference potential VSS and a common node 1210 of the active dynamic feedback circuit 1200.

The active dynamic feedback circuit 1200 comprises a third current path 1203. The active dynamic feedback circuit 1200 further comprises a current source 400 being arranged in the third current path 1203 between a terminal to provide a supply potential VDD and the common node 1210. The third current path 1203 is connected in series to each of the first and second current paths 1201 and 1202.

The buffer circuit 300 is arranged between the common node 1210 and the first input transistor 100 to decouple the first current path 1201 from the second current path 1202. The buffer circuit 300 comprises a first input node I300*a*, a second input node I300*b* and an output node O300. The first input node I300*a* of the buffer circuit 300 is connected to the common node 1210. The second input node I300*b* of the buffer circuit 300 is coupled to the output node O300 which means that the second input node I300*b* of the buffer circuit 300 can be directly connected to the output node O300, or can be coupled to the output node O300 via a feedback network.

The active dynamic feedback circuit 1200 introduces non-linearity. This is achieved, inter alia, by the fact that the first input transistor 100 can be operated in weak inversion as opposed to a conventional MOS-resistor which could be placed in the feedback path of a conventional signal shaper circuit. A conventional MOS-resistor needs to be biased in strong inversion so as to reduce the resistance variation due to its Vgate bias which spreads due to PVT variations of the bias generator.

The active dynamic feedback circuit 1200 may comprise a reference signal generation circuit 500 being coupled to the control node of the second input transistor 200 to provide the reference signal/voltage Vref. An offset of the active dynamic feedback circuit can be corrected by the reference signal generation circuit 500. The reference signal generation circuit may be configured as a resistive DAC (Digital-to-Analogue Converter) to correct the offset of the active dynamic feedback circuit amplifier.

Figure 3B:
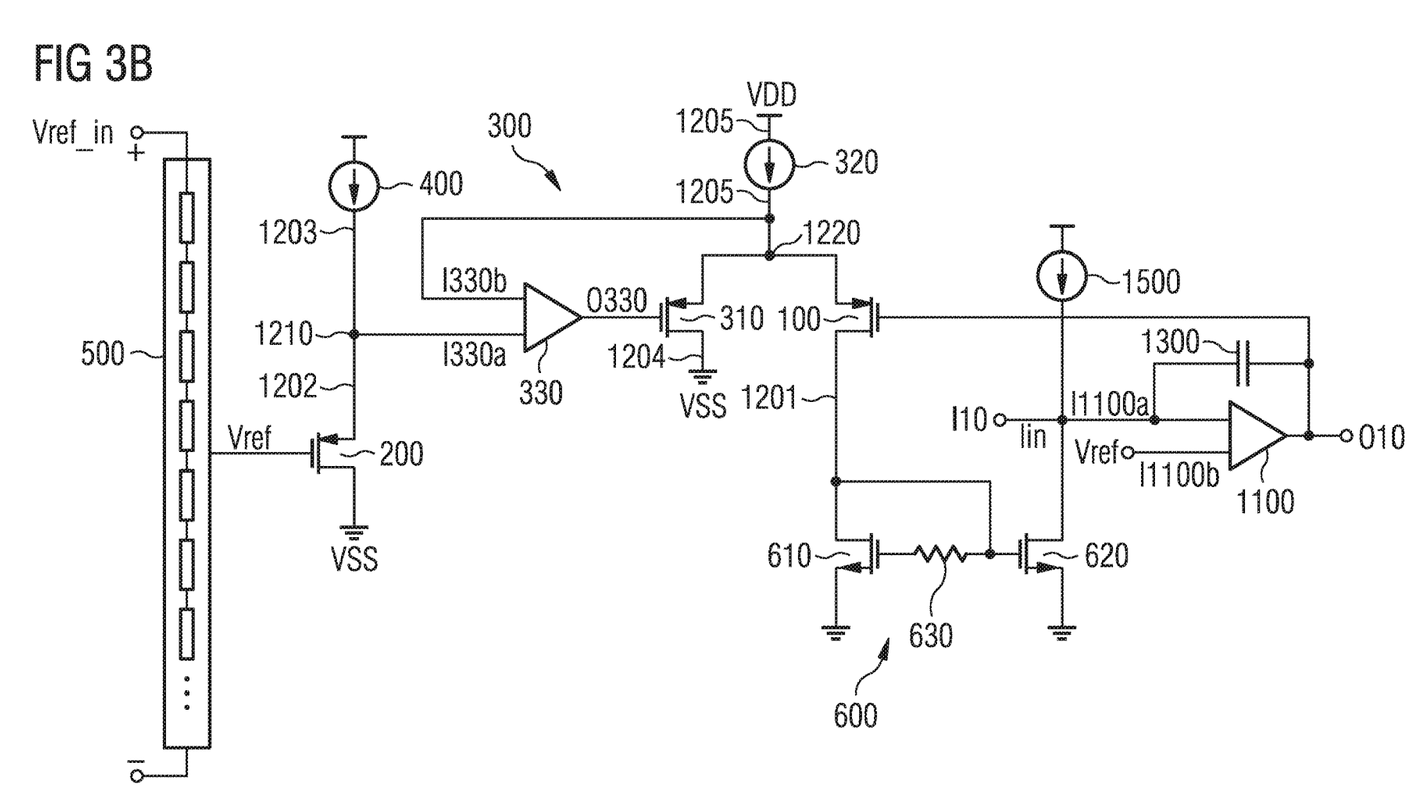
FIG. 3B shows a second embodiment of a front-end electronic circuitry for an electromagnetic radiation sensor application comprising an active dynamic feedback circuit to introduce non-linearity by realizing a non-linear feedback resistance.

FIG. 3B shows the front-end electronic circuitry 10 of FIG. 3A with an advantageous embodiment of the buffer circuit 300.

The buffer circuit 300 comprises a transistor 310 that is arranged in a fourth current path 1204 of the active dynamic feedback circuit 1200. The first current path 1201 and the fourth current path 1204 are connected in parallel between a terminal to provide a reference potential VSS and a second common node 1220 of the active dynamic feedback circuit 1200. The buffer circuit 300 further comprises a current source 320. The current source 320 is arranged in a fifth current path 1205 of the active dynamic feedback circuit 1200 between a terminal to provide a supply potential VDD and the second common node 1220.

According to an advantageous embodiment of the front-end electronic circuitry 10, the first and the second input transistor 100, 200 are matched to each other. Moreover, current source 400 is matched to current source 1500. Furthermore, current source 400 and current source 320 are matched to each other.

The buffer circuit 300 further comprises an (auxiliary) amplifier 330. The amplifier 330 has a first input node I330*a* being connected to the common node 1210 of the active dynamic feedback circuit 1200. The amplifier 330 has a second input node I330*b* that is connected to the second common node 1220 of the active dynamic feedback circuit 1200, and an output node O330 being connected to a control node of the transistor 310.

The decoupling of the bias current in the first current path 1201 and the bias current in the fourth current path 1204 allows to create a low-impedance at the second common node 1220. The (auxiliary) amplifier 330 provides an impedance transformation. In particular, the common tail node 1220 at the drain of the current source 320 can be transformed from high-impedance to low-impedance.

Non-linearity is achieved by the fact that the potential of the common tail node 1220 can be fixed with a large current by the (auxiliary) amplifier 330 so that the common tail node 1220 becomes like a low-impedance node. The decoupling of the input current in the first current path 1201 to the auxiliary current in the fourth current path 1204 is achieved via the (auxiliary) amplifier 330. Hence, the shaper output can exercise its full large signal amplitude to the first input transistor overdrive without being degraded by a voltage drop at the tail common node 1220 which would otherwise occur.

Finally, without the (auxiliary) amplifier the negative input node I1100b of the amplifier 1100 of the active dynamic feedback circuit would starve and therefore it would clip the output, especially in high energies and/or pileup events. The decoupling of the positive and negative input bias currents allows for a small current in the positive input, i.e. a small current in the first current path 1201, so as to get a low transconductance and therefore a high resistance in the feedback path 1001, and large current in the negative input, i.e. the fourth current path 1204, so as to be able to provide the excess current required by the large signal of the shaper output without getting starved and causing clipping of the output.

The main technical advantages of the front-end electronic circuitry comprising the active dynamic feedback circuit 1200 in the feedback path 1001 of the signal shaper circuit 1000 can be summarized as follows.

The provision of the active dynamic feedback circuit 1200 in the feedback path 1001 of the signal shaper circuit 1000 allows the performance of a differential input shaper to be enhanced and makes feasible the realization of a single-input shaper, as shown in FIG. 3B. The proposed active dynamic feedback circuit achieves lower FWHM by enhancing, i.e. reducing, the pulse width and therefore operates at higher count-rates. This is achieved by intentionally introducing a highly non-linear feedback resistance (1/gm) between input voltage and output current, as opposed to a linear relation in the case of polysilicon resistor or a quadratic relation in the case of a MOS resistor (NMOS) with bulk and source connected to the shaper output.

The non-linearity of a differential pair of input transistors is increased by forcing its tail node 1220 to a constant voltage using an active feedback loop so that the first input transistor 100 experiences the full shaper output voltage as gate-source voltage. Therefore, the full non-linear relationship of drain-current versus gate-source voltage of the (MOS) first input transistor 100 is exploited.

If biased in weak inversion, an exponential characteristic of the resistance in the feedback path can be realized, resulting in improved FWHM. This improves the speed of a photon counting system and the count-rate performance during pileup. Biasing in weak inversion is possible because the overdrive of the first input transistor 100 can be decoupled from the shaper baseline by proper reference voltage generation for the active feedback loop, i.e. reference voltage Vref plus gate-source voltage of input transistor 200.

At the same time, the tail current source 320 guarantees stable current definition over PVT as for a standard differential transistor pair. As the active feedback loop defines the tail potential at the second common node 1220, it decouples the current in the fourth current path 1204 from the current in the first current path 1201. This allows a highly asymmetrical biasing of the first input transistor 100 and transistor 310 of the buffer circuit 300 without matching limitations as would be the case in a standard differential pair.

Whereas the first input transistor 100 can be biased with a lower current according to the high feedback resistance requirement, transistor 310 of buffer circuit 300 can be biased with a large current in order to realize a low tail node impedance at the second common node 1220 and accomplish tail potential clamping even for high frequencies where the active feedback loop is less effective.

As the active feedback loop and low tail node impedance keep the tail node potential at the second common node 1220 constant irrespective of the shaper output, no current starving for large shaper peaks is possible as in a classical differential pair approaches. When the first input transistor 100 draws excessive current in response to large shaper peaks, it will either be supplied by the active feedback loop or the asymmetrically high biased transistor 310 of buffer circuit 300. As a result, there is no current starving for large shaper peaks because the active feedback loop and transistor 310 of buffer circuit 300 can supply excess current in the first current path 1201.

Consequently, there is no limit in pileup protection. Moreover, there is no need to provide a transconductance controller to control transconductivity of the active dynamic feedback circuit in the high speed path which allows the active dynamic feedback circuit 1200 to be operated with high speed.

The active dynamic feedback circuit 1200 further comprises a current mirror 600 being arranged between the first current path 1201 and a sixth current path 1206 of the active dynamic feedback circuit 1200. The current mirror 600 comprises a transistor 610 being arranged in the first current path 1201 and a transistor 620 being arranged in the sixth current path. The current mirror 600 enables to couple a current from the first current path 1201 in the sixth current path 1206 of the active dynamic feedback circuit 1200. The sixth current path 1206 of the active dynamic feedback circuit 1200 is connected to the input node I1100a of the amplifier circuit 1100 of the signal shaper circuit 100. The respective gate nodes of transistor 610 and 620 may be connected via at least one resistor 630 to provide mirror pole compensation.

The current mirror 600 allows downscaling of the current in the first current path 1201. Consequently, downscaling the current in the current path 1201 allows a small effective transconductance to be realized while biasing the first input transistor 100 with sufficiently high current for speed and low offset.

Figure 4A:
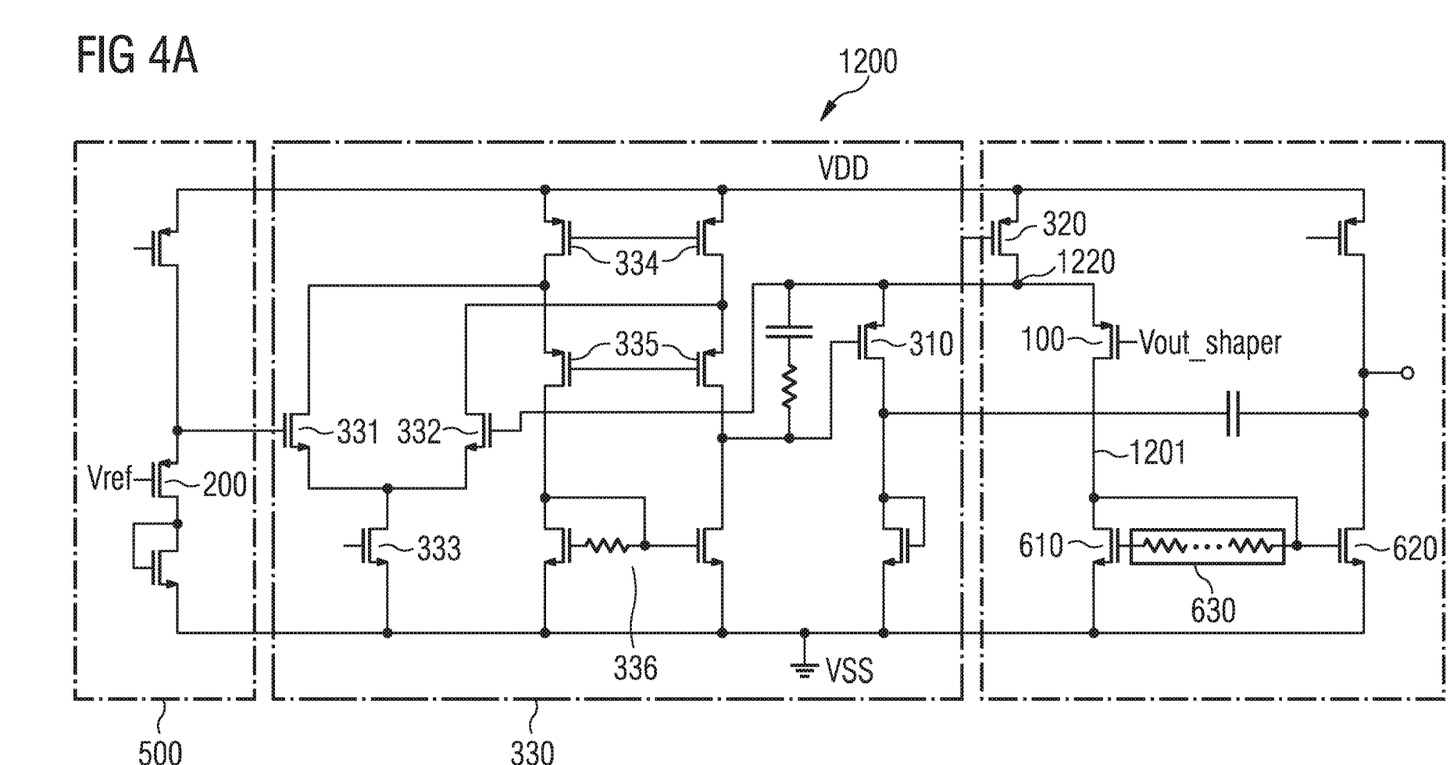
FIG. 4A shows a first embodiment of an active dynamic feedback circuit of a front-end electronic circuitry for an electromagnetic radiation sensor application with a folded auxiliary amplifier.
Figure 4B:
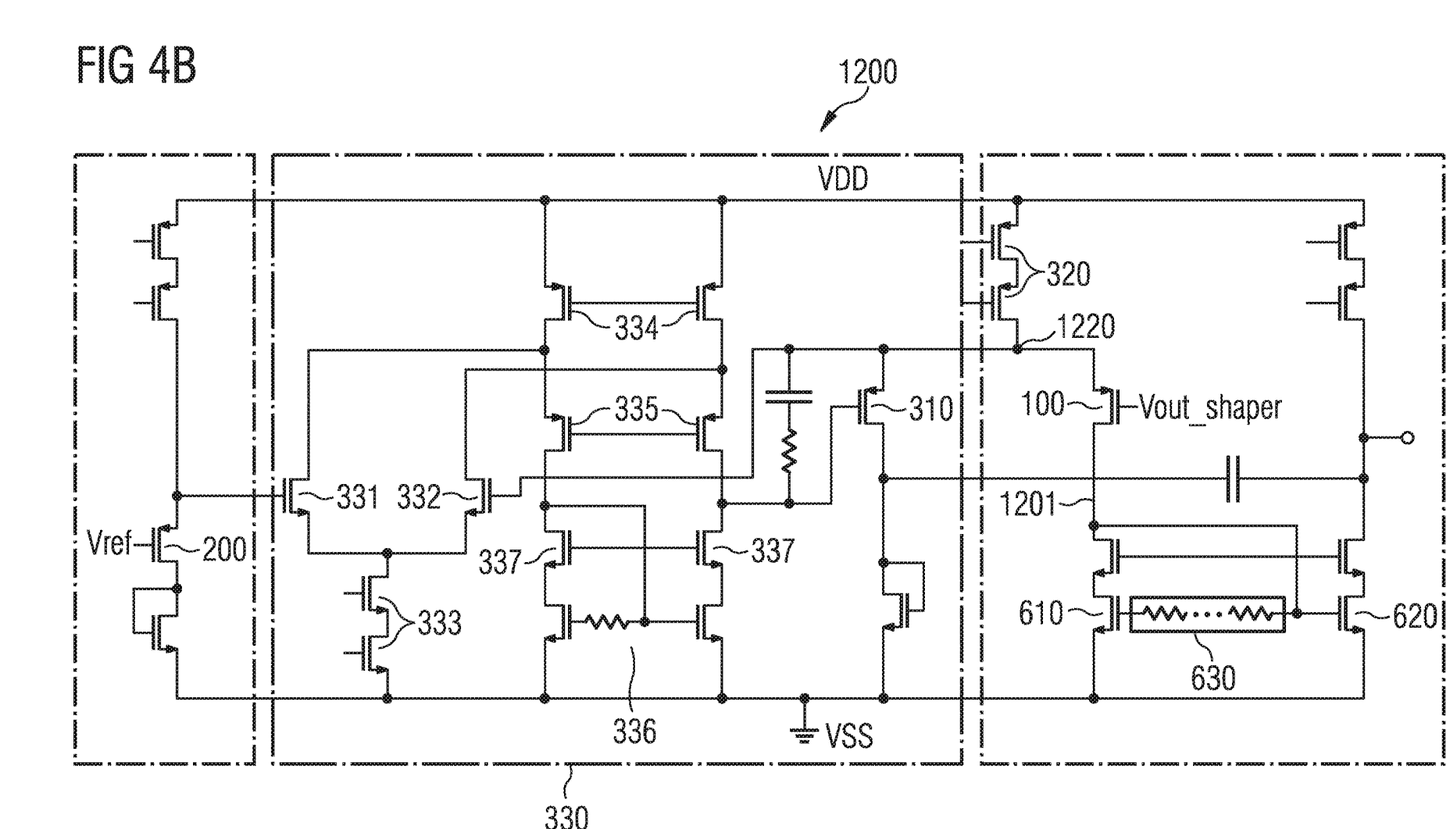
FIG. 4B shows a second embodiment of an active dynamic feedback circuit of a front-end electronic circuitry for an electromagnetic radiation sensor with a single-stage auxiliary amplifier.
Figure 4C:
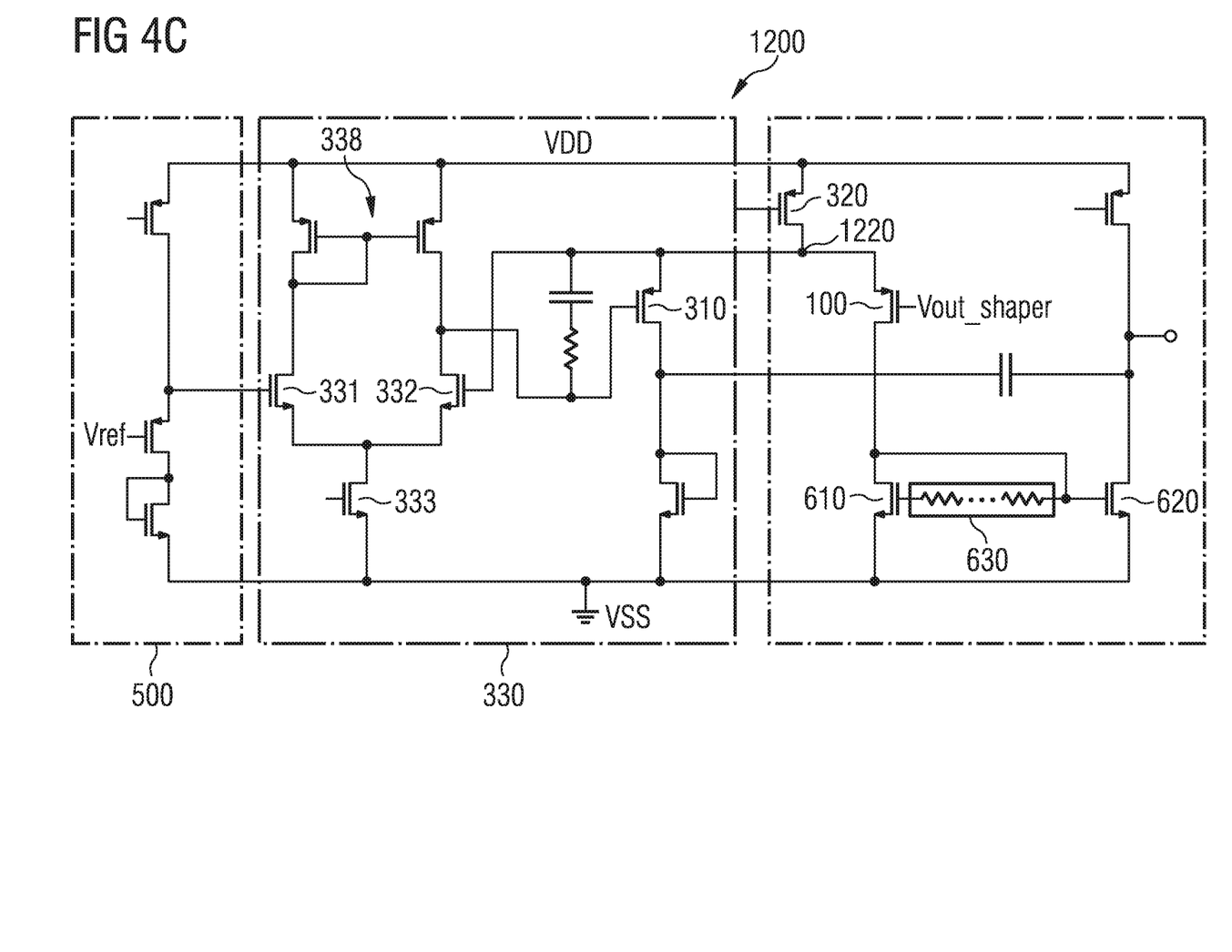
FIG. 4C shows an embodiment of an active dynamic feedback circuit of a front-end electronic circuitry for an electromagnetic radiation sensor with a folded-cascode auxiliary amplifier.

FIGS. 4A, 4B and 4C show possible implementations for the active dynamic feedback circuit 1200 shown in FIGS. 3A and 3B. The same elements as in FIGS. 3A and 3B are marked with the same reference signs in FIGS. 4A to 4C.

FIG. 4A shows an implementation for the active dynamic feedback circuit 1200 with a folded auxiliary amplifier 330 of buffer circuit 300. The auxiliary amplifier comprises differential transistor pair 331, 332 which is coupled to bias current source 333. The folded auxiliary amplifier 330 further comprises bias transistors 334, cascode transistors 335 and current mirror 336.

FIG. 4B shows an implementation for the active dynamic feedback circuit 1200 with a folded-cascode auxiliary amplifier 330 of buffer circuit 300. The folded-cascode auxiliary amplifier 330 comprises differential transistor pair 331, 332, bias current transistors 333, bias transistors 334, transistors of a first cascode stage 335, a second cascode stage 337 and current mirror 336.

FIG. 4C shows a possible implementation of the active dynamic feedback circuit 1200 with a single-stage auxiliary amplifier 330 of buffer circuit 300. The auxiliary amplifier 330 comprises differential transistor pair 331, 332, bias transistor 333 and current mirror 338.

Figure 5A:
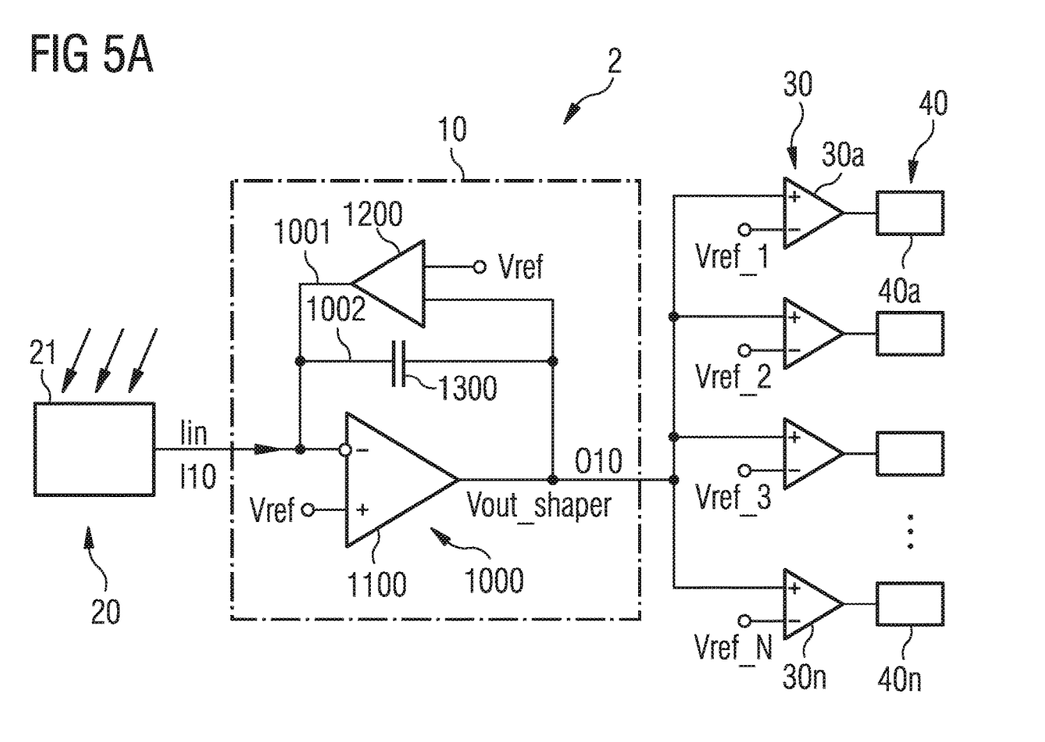
FIG. 5A shows an architectural diagram of a first embodiment of a photon counting circuitry with a single-stage approach of a front-end electronic circuitry.
Figure 5B:
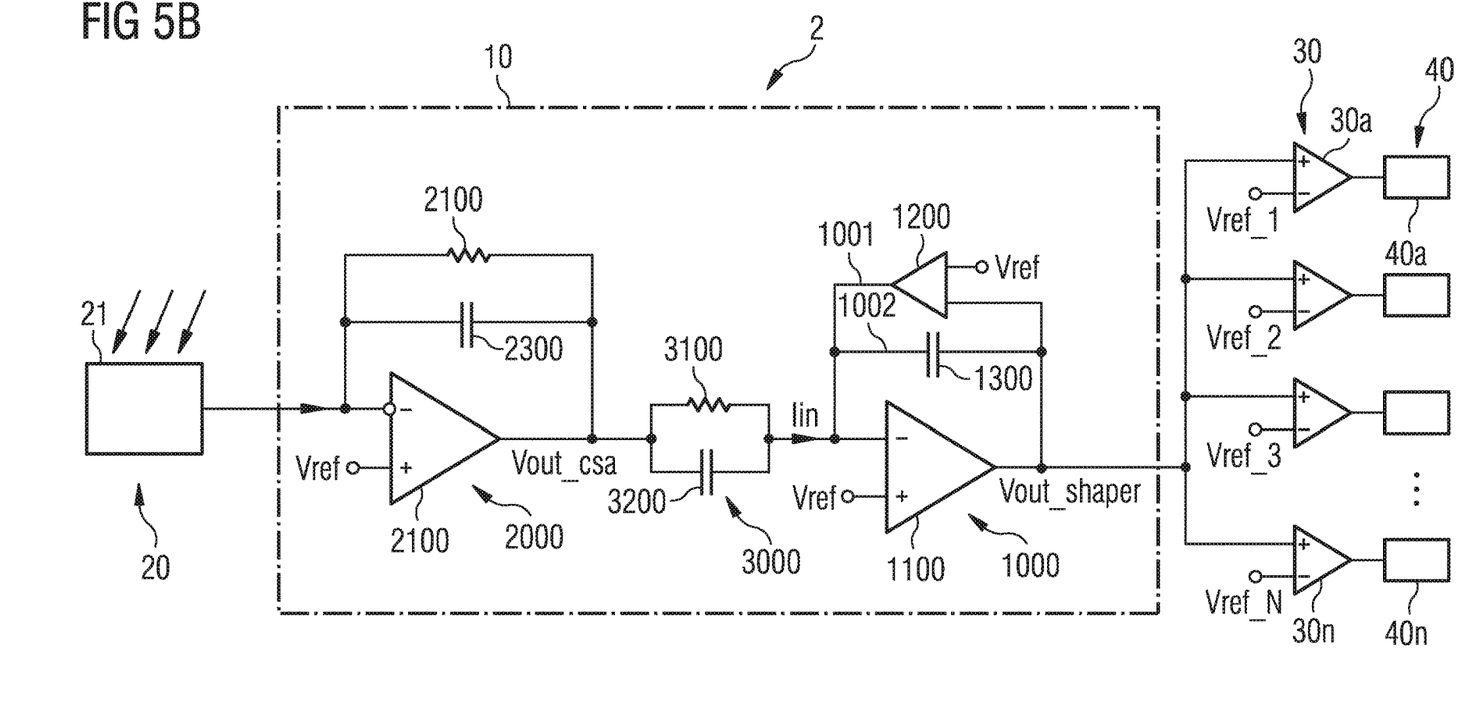
FIG. 5B shows an architectural diagram of a photon counting circuitry with a two-stage approach of a front-end electronic circuitry.

The proposed design of the front-end electronic circuitry 10 comprising a signal shaper circuit 1000 with an active dynamic feedback circuit 1200 in feedback path 1001 can be provided in a photon counting circuitry having a single-stage architecture, as shown in FIG. 5A, or a two-stage architectural approach, as shown in FIG. 5B. FIGS. 5A and 5B show the active dynamic feedback circuitry 1200 in a differential-input configuration. An implementation of the active dynamic feedback circuit 1200 in a single-input configuration is also possible.

Referring to the single-stage architecture of a photon counting circuitry 2 of FIG. 5A, a photon detector 20 having a photon sensitive area 21 is connected to the input terminal I10 of the front-end electronic circuitry 10. The photon detector 20 is configured to generate a current pulse, when a photon hits the photon sensitive area 21.

The front-end electronic circuitry 10 is configured to generate a voltage pulse of the output signal Vout_shaper at the output node O10, when the current pulse generated by the photon detector 20 is applied to the input terminal I10 of the front-end electronic circuitry 10. The shaper output voltage Vout_shaper is then further processed by several discriminator circuits 30a, . . . , 30n of an energy discriminator 30. The energy discriminator 30 is configured to generate a digital signal in dependence on a level of the voltage pulse at the output terminal O10. The discriminator's output is then fed into counter circuits 40a, . . . , 40n of a counter 40. The number of counts is proportional to the number of incident photons. Having multiple discriminator circuits 30a, . . . , 30n and counter circuits 40a, . . . , 40n will give information on the energy level of each incident photon. The counter outputs may be processed by a DSP (Digital-Signal-Processor), not shown in FIG. 5A.

For small and fixed input capacitance, the single-stage architecture of the photon counting circuitry 2 shown in FIG. 5A can be employed. For a large and varying input capacitance, the two-stage architectural approach of photon counting circuitry 2 as shown in FIG. 5B can be used.

Referring to the two-stage architectural approach of photon counting circuit 2 of FIG. 5B, the signal shaper circuit 1000 is coupled to the input terminal I10 via a charge sensitive amplifier circuit 2000 which acts as a buffer to decouple the signal shaper circuit 1000 from an input capacitance at the input terminal I10. The charge sensitive amplifier circuit 2000 comprises an operational transconductance amplifier 2100, a feedback resistor 2200, and a feedback capacitor 2300. The charge sensitive amplifier circuit 2000 and the signal shaper circuit 1000 are coupled by a coupling network 3000 comprising parallel connection of resistor 3100 and capacitor 3200.

When using the active dynamic feedback circuit 1200 in a signal shaper circuit of a front-end electronic circuitry of a photon counting application, a small FWHM may be achieved which provides the budget in terms of speed and count-rate, to increase the capacitance of feedback capacitor 1300. By increasing the capacitance of capacitor 1300, low ballistic deficit can be achieved.

In addition to the uses of the front-end electronic circuitry 10 in a photon counting application, the proposed configuration of the front-end electronic circuitry 10 comprising the active dynamic feedback circuit 1200 as shown in FIGS. 3A, 3B or 4A to 4C may be used for various X-ray imaging applications, such as computed tomography, security, food or baggage inspection, materials and electronics inspection for defects, etc.

Figure 6:
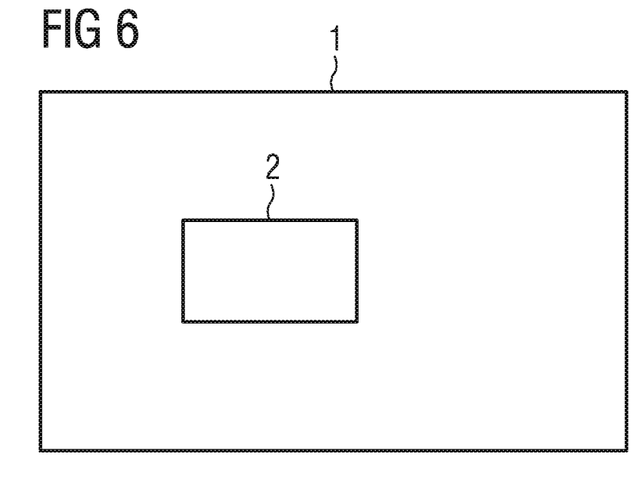
FIG. 6 shows a device for medical diagnostics comprising a photon counting circuitry.

FIG. 6 shows an example of an application where a photon counting circuitry 2 equipped with the front-end electronic circuitry 10 according to one of the approaches shown in FIGS. 3A, 3B, or 4A to 4C, is provided in a device 1 for medical diagnostics. The device 1 for medical diagnostics may be configured, for example, as an X-ray apparatus or a computed tomography scanner.

The embodiments of the front-end electronic circuitry disclosed herein have been discussed for the purpose of familiarizing the reader with novel aspects of the design of the front-end circuitry. Although embodiments have been shown and described, many changes, modifications, equivalents and substitutions of the disclosed concepts may be made by one having skill in the art without unnecessarily departing from the scope of the claims.

In particular, the design of the front-end electronic circuitry is not limited to the disclosed embodiments, and gives examples of many alternatives as possible for the features included in the embodiments discussed. However, it is intended that any modifications, equivalents and substitutions of the disclosed concepts be included within the scope of the claims which are appended hereto.

Features recited in separate dependent claims may be advantageously combined. Moreover, reference signs used in the claims are not limited to be construed as limiting the scope of the claims.

Furthermore, as used herein, the term "comprising" does not exclude other elements. In addition, as used herein, the article "a" is intended to include one or more than one component or element, and is not limited to be construed as meaning only one.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

LIST OF REFERENCE SIGNS 1 device for medical diagnostics
2 photon counting circuitry
10 front-end electronic circuitry
20 photon detector
30 energy discriminator
40 counter
100 first input transistor
200 second input transistor
300 buffer circuit
310 transistor
320 current source
330 amplifier
400 current source
500 reference signal generation circuit
600 current mirror
1000 signal shaper circuit
1100 amplifier circuit
1200 active dynamic feedback circuit
1300 capacitor
2000 charge sensitive amplifier circuit
2100 operational transconductance amplifier
2200 feedback resistor
2300 capacitor
3000 coupling network
3100 capacitor
3200 resistor

The invention claimed is:
1. A front-end electronic circuitry for an electromagnetic radiation sensor application, comprising:

an input terminal being configured to be coupled to an electromagnetic radiation sensor to receive an input signal from the sensor, an output terminal to provide an output signal, a signal shaper circuit comprising an amplifier circuit and an active dynamic feedback circuit, the active dynamic feedback circuit being arranged in a feedback path of the signal shaper circuit, wherein the amplifier circuit has an input node being coupled to the input terminal and an output node to provide the output signal, the output node being coupled to the output terminal, wherein the active dynamic feedback circuit comprises a first input transistor being arranged in a first current path of the active dynamic feedback circuit, and a second input transistor being arranged in a second current path of the active dynamic feedback circuit, wherein the first input transistor has a control node to receive the output signal, wherein the second input transistor has a control node to receive a reference signal, wherein the active dynamic feedback circuit comprises a buffer circuit being arranged to decouple the first and second current path.

2. The front-end electronic circuitry of claim 1,
wherein the first current path and the second current path are respectively connected between a terminal to provide a reference potential and a common node of the active dynamic feedback circuit,
wherein the buffer circuit is arranged between the common node and the first input transistor.

3. The front-end electronic circuitry of claim 2,
wherein the active dynamic feedback circuit comprises a third current path,
wherein the active dynamic feedback circuit comprises a current source being arranged in the third current path between a terminal to provide a supply potential and the common node,
wherein the third current path is connected in series to each of the first and the second current path.

4. The front-end electronic circuitry of claim 3,
wherein the buffer circuit comprises a first and a second input node and an output node,
wherein the first input node of the buffer circuit is connected to the common node,
wherein the second input node of the buffer circuit is coupled to the output node of the buffer circuit,
wherein the output node of the buffer circuit is connected to the first input transistor.

5. The front-end electronic circuitry of claim 3,
wherein the buffer circuit comprises a transistor, and a current source,
wherein the transistor is arranged in a fourth current path of the active dynamic feedback circuit,
wherein the first current path and the fourth current path are connected in parallel between a terminal to provide a reference potential and a second common node of the active dynamic feedback circuit,
wherein the current source is arranged in a fifth current path of the active dynamic feedback circuit between a terminal to provide a supply potential and the second common node.

6. The front-end electronic circuitry of claim 5,
wherein the buffer circuit comprises an amplifier having a first input node being connected to the common node of the active dynamic feedback circuit, a second input node being connected to the second common node of the active dynamic feedback circuit, and an output node being connected to a control node of the transistor.

7. The front-end electronic circuitry of claim 1, comprising:
a reference signal generation circuit being coupled to the control node of the second input transistor to provide the reference signal.

8. The front-end electronic circuitry of claim 1,
wherein the active dynamic feedback circuit comprises a current mirror being arranged between the first current path and a sixth current path of the active dynamic feedback circuit to couple a current from the first current path in the sixth current path of the active dynamic feedback circuit,
wherein the sixth current path of the active dynamic feedback circuit is connected to the input node of the amplifier circuit of the signal shaper circuit.

9. The front-end electronic circuitry of claim 8,
wherein the current mirror comprises a first mirror transistor being arranged in the first current path and a second mirror transistor being arranged in the sixth current path,
wherein the current mirror comprises at least one resistor being arranged between a gate node of the first mirror transistor and a gate node of the second mirror transistor.

10. The front-end electronic circuitry of claim 1, wherein the first input transistor is operated in weak inversion.

11. The front-end electronic circuitry of claim 1,
wherein the first and the second input transistor are matched to each other, and/or
wherein a first current source and a second current source are matched to each other.

12. The front-end electronic circuitry of claim 1,
wherein the signal shaper circuit comprises a feedback capacitor being arranged between the input node of the amplifier circuit and the output node of the amplifier circuit,
wherein the signal shaper circuit comprises a third current source being arranged between a terminal to provide a supply potential and the input terminal,
wherein a first current source is matched to the third current source.

13. The front-end electronic circuitry of claim 1, wherein the amplifier circuit is embodied in a single-input, single-out configuration or in a differential-input, single-output configuration.

14. A photon counting circuitry, comprising:
a front-end electronic circuitry, comprising:
an input terminal being configured to be coupled to an electromagnetic radiation sensor to receive an input signal from the sensor,
an output terminal to provide an output signal,
a signal shaper circuit comprising an amplifier circuit and an active dynamic feedback circuit, the active dynamic feedback circuit being arranged in a feedback path of the signal shaper circuit,
wherein the amplifier circuit has an input node being coupled to the input terminal and an output node to provide the output signal, the output node being coupled to the output terminal,
wherein the active dynamic feedback circuit comprises a first input transistor being arranged in a first current path of the active dynamic feedback circuit, and a second input transistor being arranged in a second current path of the active dynamic feedback circuit, wherein the first input transistor has a control node to receive the output signal, wherein the second input transistor has a control node to receive a reference signal, wherein the active dynamic feedback circuit comprises a buffer circuit being arranged to decouple the first and second current path;

a photon detector having a photon sensitive area, the photon detector being configured to generate a current pulse, when a photon hits the photon sensitive area, an energy discriminator being connected to the output terminal of the front-end electronic circuitry, wherein the photon detector is connected to the input terminal of the front-end electronic circuitry, wherein the front-end electronic circuitry is configured to generate a voltage pulse at the output node of the front-end electronic circuitry, when the current pulse is applied to the input node of the front-end electronic circuitry, wherein the energy discriminator is configured to generate a digital signal in dependence on a level of the voltage pulse.

15. A device for medical diagnostics, comprising:

the device comprising:

a front-end electronic circuitry comprising:

an input terminal being configured to be coupled to an electromagnetic radiation sensor to receive an input signal from the sensor, an output terminal to provide an output signal, a signal shaper circuit comprising an amplifier circuit and an active dynamic feedback circuit, the active dynamic feedback circuit being arranged in a feedback path of the signal shaper circuit, wherein the amplifier circuit has an input node being coupled to the input terminal and an output node to provide the output signal, the output node being coupled to the output terminal, wherein the active dynamic feedback circuit comprises a first input transistor being arranged in a first current path of the active dynamic feedback circuit, and a second input transistor being arranged in a second current path of the active dynamic feedback circuit, wherein the first input transistor has a control node to receive the output signal, wherein the second input transistor has a control node to receive a reference signal, wherein the active dynamic feedback circuit comprises a buffer circuit being arranged to decouple the first and second current path;

a photon detector having a photon sensitive area, the photon detector being configured to generate a current pulse, when a photon hits the photon sensitive area, an energy discriminator being connected to the output terminal of the front-end electronic circuitry, wherein the photon detector is connected to the input terminal of the front-end electronic circuitry, wherein the front-end electronic circuitry is configured to generate a voltage pulse at the output node of the front-end electronic circuitry, when the current pulse is applied to the input node of the front-end electronic circuitry, wherein the energy discriminator is configured to generate a digital signal in dependence on a level of the voltage pulse;

wherein the device is configured as an X-ray apparatus or a computed tomography scanner.

* * * * *